United States Patent
Ogawa

(10) Patent No.: US 7,984,655 B2
(45) Date of Patent: Jul. 26, 2011

(54) ENTRAPMENT DETECTION AND PREVENTION DEVICE FOR OPENING/CLOSING MECHANISM

(75) Inventor: Shunichi Ogawa, Nagoya (JP)

(73) Assignee: Freescale Semiconductor, Inc., Austin, TX (US)

( * ) Notice: Subject to any disclaimer, the term of this patent is extended or adjusted under 35 U.S.C. 154(b) by 200 days.

(21) Appl. No.: 12/467,306

(22) Filed: May 18, 2009

(65) Prior Publication Data

US 2009/0314098 A1  Dec. 24, 2009

(30) Foreign Application Priority Data

Jun. 19, 2008 (JP) .................. 2008-160565

(51) Int. Cl.
*G01B 7/16* (2006.01)
(52) U.S. Cl. .................. 73/780; 73/862.626
(58) Field of Classification Search ............ 73/780, 73/862.626
See application file for complete search history.

(56) References Cited

U.S. PATENT DOCUMENTS

| 7,132,642 B2* | 11/2006 | Shank et al. .......... 250/221 |
| 7,464,980 B2* | 12/2008 | Gutendorf et al. ....... 296/107.01 |
| 7,548,809 B2* | 6/2009 | Westerhoff ............. 701/49 |
| 7,714,595 B2* | 5/2010 | Fujiwara et al. ........ 324/663 |

FOREIGN PATENT DOCUMENTS

| JP | 2003148046 A | 5/2003 |
| JP | 2003336448 A | 11/2003 |
| JP | 2007009456 A | 1/2007 |

* cited by examiner

*Primary Examiner* — Max Noori
(74) *Attorney, Agent, or Firm* — Charles Bergere

(57) ABSTRACT

An entrapment prevention and detection device for an opening/closing mechanism detects entrapment with a simple structure and does not occupy much space. When a foreign object, such as a human body part approaches a window glass, such as an automobile window, the capacitance of a capacitive sensor increases. A control circuit compares a most recent capacitance obtained by a capacitance detection circuit with a previous value and if the most recent capacitance value is greater than the previous value, when the glass is being raised (closed), the control circuit determines that a foreign object has approached the glass and then stops or lowers (opens) the glass.

8 Claims, 4 Drawing Sheets

ENTRAPMENT DETECTION AND PREVENTION DEVICE FOR OPENING/CLOSING MECHANISM

BACKGROUND OF THE INVENTION

The present invention relates to an entrapment detection and prevention device for an opening/closing mechanism.

A power window, which opens and closes when driven by a motor, is often used in automobiles door windows. For such motor-driven power windows, various types of entrapment prevention devices have been proposed (see, for example, Japanese Laid-Open Patent Publications Nos. 2003-148046, 2007-9456, 2001-32628). For example, if a foreign object such as a human body or a human body part is trapped between the window glass and window frame when the window glass is being closed, the entrapment prevention device detects such entrapment, immediately stops the movement of the glass, and opens the window glass.

In Japanese Laid-Open Patent Publication No. 2003-148046, a change in the rotational load applied to a motor, which drives and opens or closes a window glass, is detected. If the rotational load of the motor reaches a predetermined value, it is determined that a foreign object is obstructing the movement.

In Japanese Laid-Open Patent Publication No. 2007-9456, a sonar sensor, photoelectric sensor, or touch sensor is arranged in an opening/closing portion and a human body part is detected before it becomes trapped.

In Japanese Laid-Open Patent Publication No. 2001-32628, a sensor electrode formed by a conductor is arranged in the window frame. The sensor detects the capacitance generated between the sensor electrode and window glass. If the detected value exceeds a reference capacitance, it is determined that entrapment of a foreign object has occurred.

However, in Japanese Laid-Open Patent Publication No. 2003-148046, it is determined that a foreign object has been trapped only when such entrapment actually occurs and the load of the motor exceeds a predetermined reference value. In other words, a foreign object is detected only after the object comes into contact with the window glass. As a result, by the time of detection, a considerable amount of force may already have been applied to the object.

If the object is soft, the load generated by the contact between the object and the window glass may not reach such a level in which it is determined that the object is trapped and in such a case, the window glass will continue to close. This may damage the object.

The photoelectric sensor or sonar sensor described in Japanese Laid-Open Patent Publication No. 2007-9456 requires a complicated transceiver to transmit or receive light or sound waves. A complicated processing circuit is also necessary to perform signal processing on the received light or sound waves. Further, the touch sensor disclosed in Japanese Laid-Open Patent Publication No. 2007-9456 is of a mechanical type. Thus, arrangement of the touch sensor in the vicinity of a door window where space is limited is technically difficult. Even if the arrangement of the touch sensor at such a location is possible, this would be disadvantageous in terms of durability.

In Japanese Laid-Open Patent Publication No. 2001-32628, it is determined that there is a foreign object only if the object has actually been trapped and the capacitance exceeds a predetermined reference value in the same manner as in Japanese Laid-Open Patent Publication No. 2003-148046. A foreign object is detected only after the object contacts the window glass, and the determination of entrapment is greatly influenced by the reference capacitance value. Thus, even if entrapment actually occurs, such a determination may not be made. Therefore, depending on the size of the object, an entrapment determination may be given only after a considerable amount of force has been applied to the object.

Accordingly, it is an object of the present invention to provide an entrapment prevention device for an opening/closing mechanism capable of detecting entrapment under any condition with a simple structure that does not occupy much space.

It is another object of the invention to provide an entrapment detection device for an opening/closing mechanism capable of detecting entrapment under any condition with a simple structure.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE EMBODIMENT

A preferred embodiment of an entrapment prevention device for a vehicle according to the present invention will now be described with reference to the drawings.

One aspect of the present invention is an entrapment prevention device for an opening/closing mechanism including a capacitance sensor arranged on at least either one of a movable body, which opens or closes a space when an actuator is driven, and a receiving position, at which the movable body is received at a fully closed position. The entrapment prevention device detects a foreign object between the movable body and the receiving position with the capacitance sensor during a full closing movement and avoids entrapment of the foreign object when detecting the foreign object. The entrapment prevention device includes an actuator drive means for driving the actuator to perform an opening/closing movement with the movable body. A capacitance calculation means receives a detection signal from the capacitance sensor and calculates a present capacitance. A memory means stores the capacitance calculated by the capacitance calculation means. A comparison means compares a most recent capacitance calculated by the capacitance calculation means with a previous capacitance stored in the memory means. A determination means determines whether a foreign object is located between the movable body and the receiving position based on the comparison of the comparison means. An actuator drive control means outputs a drive control signal to the actuator drive means in order to stop the movable body or perform an opening movement with the movable body through the actuator when the determination means determines the approach of a foreign object.

A further aspect of the present invention is an entrapment detection device for an opening/closing mechanism that detects a foreign object located between a movable body, which opens and closes a space, and a receiving position, at which the movable body is received at a fully closed position, based on a detection signal from a capacitance sensor arranged on at least either one of the movable body and the receiving position. The entrapment detection device includes a capacitance calculation means for receiving the detection signal from the capacitance sensor and calculating a present capacitance. A memory means stores the capacitance calculated by the capacitance calculation means. A comparison means compares the capacitance calculated by the capacitance calculation means with a previous capacitance stored in the memory means. A determination means determines whether a foreign object is located between the movable body and the receiving position based on the comparison of the comparison means.

Other aspects and advantages of the present invention will become apparent from the following description, taken in conjunction with the accompanying drawings, illustrating by way of example the principles of the invention.

Figure 1:
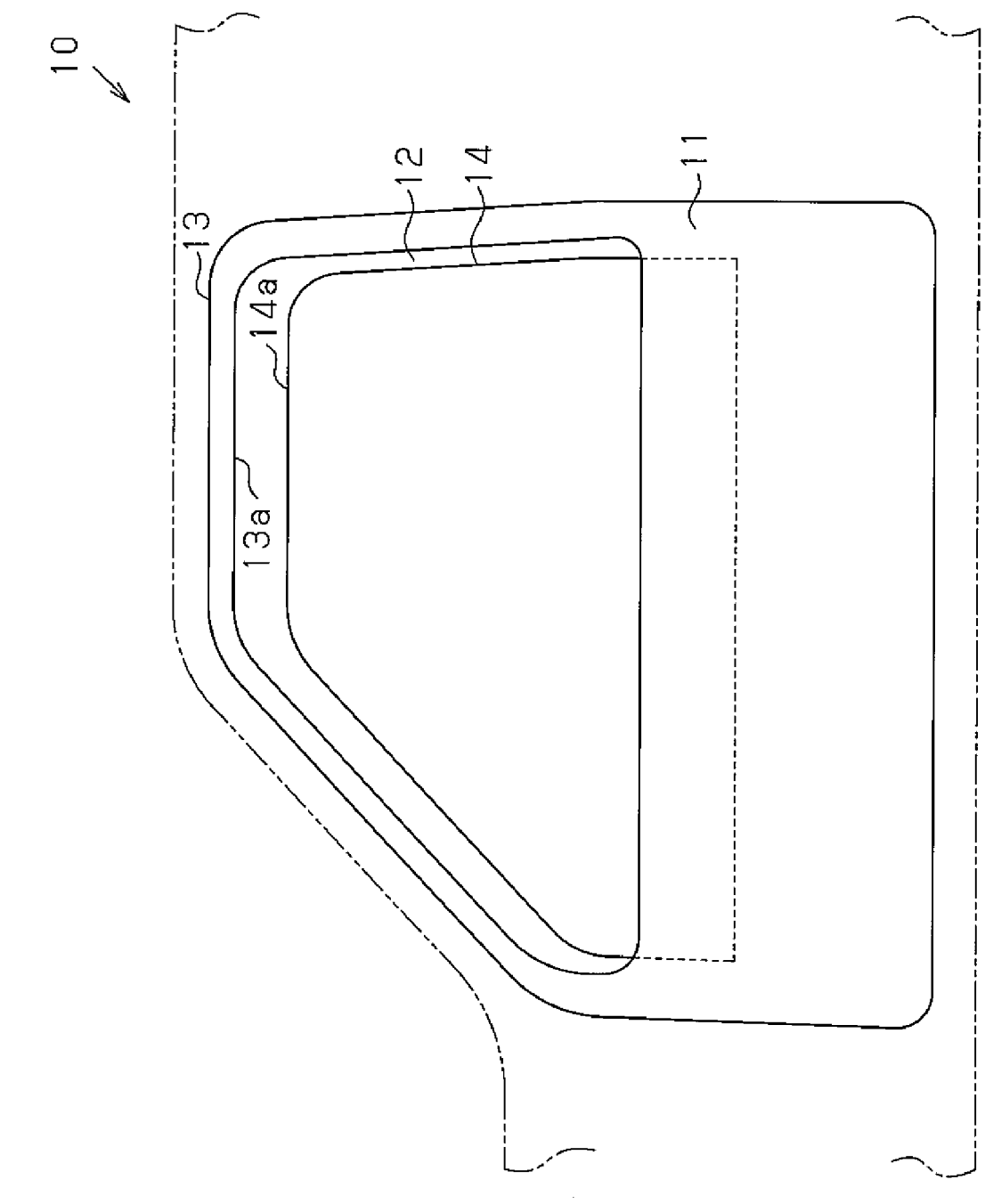
FIG. 1 is a view showing a window glass provided in a door of a vehicle.

Referring now to FIG. 1, a vehicle 10 including doors 11 with windows 12 is shown. A movable body or window glass 14 is arranged in the window 12 of each door 11, and an identical opening/closing mechanism is arranged in each door 11. Since the opening/closing mechanisms are identical, for the sake of brevity, the window glass 14 of only one of the doors 11 will be discussed below and the other window glasses 14 will not be described in detail.

The window glass 14 is raised or lowered by a lift mechanism (not shown), which is operated by forward or reverse rotation produced by a drive motor 16 (see FIG. 3) serving as an actuator and arranged in the door 11. This opens or closes the window 12. In the illustrated embodiment, the glass 14 is raised to a fully closed position when the drive motor 16 produces rotation in a forward direction and a peripheral surface 14a of the glass 14 abuts an inner surface 13a of a window frame 13. When the glass 14 reaches the fully closed position, the motor 16 is stopped and the glass 14 is maintained in the fully closed position. When the motor 16 produces rotation in a reverse direction, the glass 14 is lowered until it becomes completely recessed within the door 11 thereby attaining a fully open position. When the glass 14 reaches the fully open position, the motor 16 is stopped and the glass 14 is maintained in the fully open position.

Figure 2A:
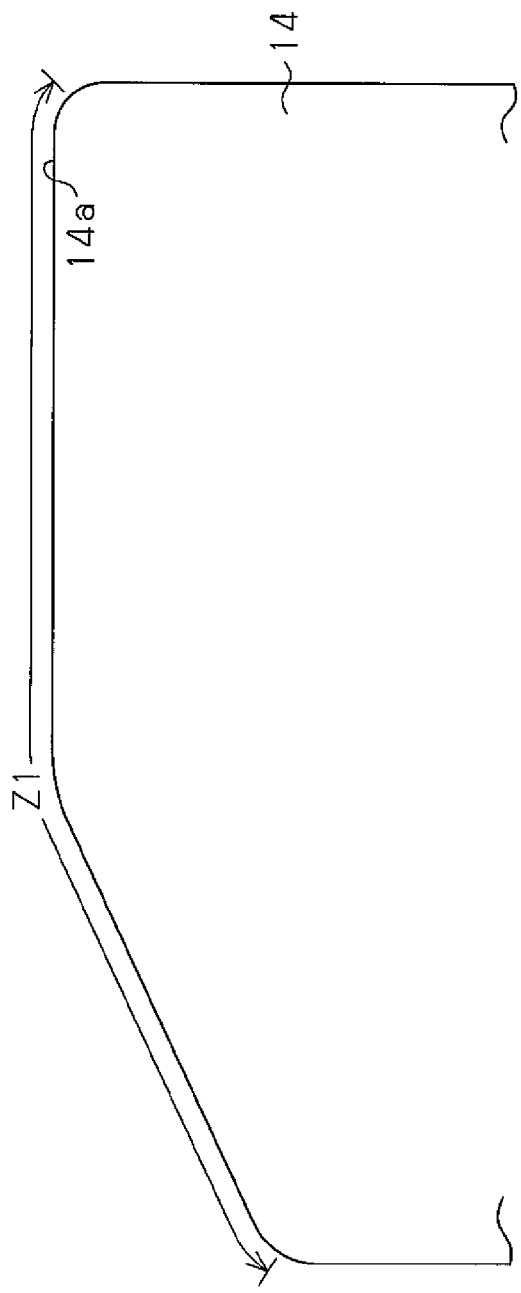
FIG. 2A is a front view showing a main portion of the window glass.
Figure 2B:
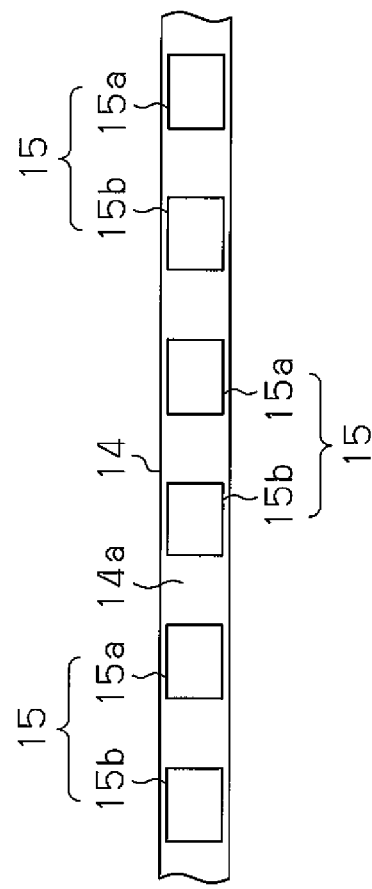
FIG. 2B is a plan view showing the main portion of the window glass.

As illustrated in FIGS. 2A and 2B, a plurality of capacitance sensors 15 are arranged in a predetermined zone Z1 defined on the peripheral surface 14a of the glass 14, which contacts the inner surface 13a of the window frame 13. The capacitance sensors 15 are spaced apart from one another at predetermined intervals. The capacitance sensors 15 each include a positive electrode film 15a, which serves as a first electrode, and a negative electrode film 15b, which serves as a second electrode. The positive and negative electrode films 15a and 15b are both generally rectangular and transparent ITO thin-film electrodes. The positive and negative electrode films 15a and 15b are spaced apart at uniform intervals along the peripheral surface 14a of the window 14. The positive electrode films 15a are coupled to an entrapment prevention device 20 (see FIG. 3) and the negative electrode films 15b are coupled to ground. The films 15a and 15b may be coupled to the entrapment device 20 and ground, respectively, by wires (not shown).

AC voltage is applied to the positive electrode films 15a to detect changes in the capacitance Cn between the corresponding positive and negative electrode films 15a and 15b. The capacitance Cn between a pair of electrode films 15a and 15b increases when a human body or a human body part approaches the area above the space between electrode films 15a and 15b.

Figure 3:
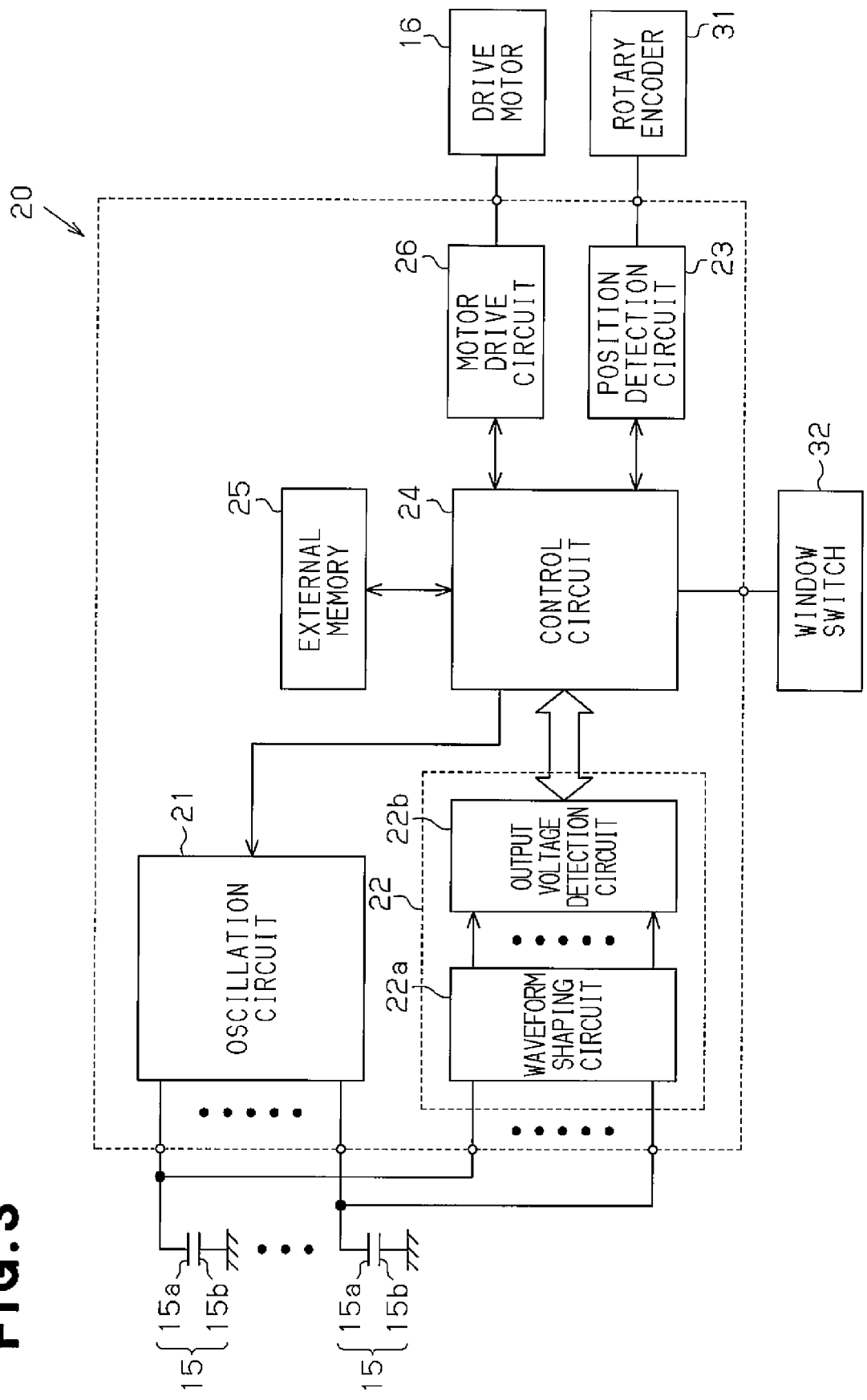
FIG. 3 is a block diagram representing an electric circuit of an entrapment prevention device.

The electrical structure of the entrapment prevention device 20, which prevents entrapment with the window glass 14 by detecting the capacitance Cn of each capacitive sensor 15 on the glass 14, will hereafter be described with reference to FIG. 3.

The entrapment prevention device 20 detects entrapment caused by the window glass 14 of each door 11. The detection is basically performed in the same manner for all of the window glasses 14. Therefore, for the sake of brevity, the following description will focus only on entrapment detection for the glass 14 of only one of the doors 11.

The entrapment prevention device 20 includes an oscillator circuit 21, a capacitance detection circuit 22 serving as capacitance calculation means, a position detection circuit 23 serving as position calculation means, a control circuit 24 serving as comparison means, determination means, and actuator drive control means, an external memory 25 serving as memory means, and a motor drive circuit 26 serving as actuator drive means.

The oscillator circuit 21 generates and applies AC voltage to the positive electrode films 15a of the capacitive sensor 15. In the illustrated embodiment, the oscillator circuit 21 generates a sine-wave AC voltage with a frequency of 120 kHz and a maximum value of 5 Volts. When the sine-wave AC voltage is applied to the positive electrode films 15a, the voltage of the positive electrode films 15a changes when the capacitance Cn changes between the positive electrode film 15a and the negative electrode film 15b. As the capacitance Cn between the positive electrode films 15a and negative electrode films 15b increases, the voltage of the positive electrode films 15a becomes a sine-wave AC voltage wherein a maximum value thereof decreases.

That is, as a foreign object such as a human body part approaches the area between the positive electrode film 15a and the negative electrode film 15b, the capacitance Cn of the capacitive sensor 15 increases. As a result, the voltage of the positive electrode film 15a becomes a sine-wave AC voltage with a maximum value that is less than 5 Volts.

The capacitance detection circuit 22 includes a waveform shaping circuit 22a and an output voltage detection circuit 22b. The capacitance detection circuit 22 converts the capacitance Cn of each capacitive sensor 15 to a digital voltage value.

The waveform shaping circuit 22a includes a full-wave rectifier formed by diodes and a low-pass filter. The full-wave rectifier and the low-pass filter are used with each of the capacitance sensors 15. The full-wave rectifier is connected to the positive electrode films 15a of the capacitance sensors 15. The full-wave rectifier thus receives the AC voltage applied to each positive electrode film 15a (corresponding to the present capacitance Cn), performs full-wave rectification on the AC voltage, and transmits the AC voltage to the low-pass filter.

The low-pass filter then smoothes ripple in the direct current that has undergone full-wave rectification and converts the current to a DC voltage that corresponds to the AC voltage applied to the positive electrode film 15a. More specifically, the waveform shaping circuit 22a generates and outputs a DC voltage corresponding to the level of the capacitance Cn of each capacitive sensor 15. The waveform shaping circuit 22a outputs a DC voltage that decreases as the capacitance Cn of the capacitive sensor 15 increases.

The output voltage detection circuit 22b receives the DC voltage Vn corresponding to the present capacitance Cn of the capacitive sensors 15 from the waveform shaping circuit 22a. The output voltage detection circuit 22b, which comprises a digital conversion circuit, converts the DC voltage Vn corresponding to the present capacitance Cn of the capacitive sensors 15 to a digital value. The output voltage detection circuit 22b then provides the digital value to the control circuit 24. The control circuit 24 temporarily stores the digital value as data of the present capacitance Cn in an external memory 25.

The position detection circuit 23, which includes an adding/subtracting counter, receives a detection signal from a motor rotation detection sensor or rotary encoder 31, which may be part of the drive motor 16. The position detection circuit 23 determines the present position of the glass 14 from the detection signal.

More specifically, the motor rotation detection sensor 31 acts as a position sensor formed with a rotary encoder. Whenever the drive motor 16 produces a predetermined amount of rotation, the motor rotation detection sensor 31 outputs two types of inverted rectangular wave signals (detection signals). The rectangular wave signals have waveforms that are offset from each other by a phase difference of 90 degrees. The position detection circuit 23 compares the levels of the two rectangular wave signals to determine whether the drive motor 16 is producing rotation in a forward direction or a reverse direction, that is, whether the glass 14 is being raised or lowered. Then, the position detection circuit 23 determines the position of the glass 14 by adding or subtracting one of the two rectangular wave signals.

The adding/subtracting counter of the position detection circuit 23 adds "1" for a rectangular wave signal output when the drive motor 16 is producing reverse rotation (when the glass 14 is being lowered) and subtracts "1" for a rectangular wave signal output when the drive motor 16 is producing forward rotation (when the glass 14 is being raised). The position detection circuit 23 then outputs the present count of the adding/subtracting counter to the control circuit 24 as data of the present position together with the data of the moving direction (up, down or stop) of the glass 14. Each data is temporarily stored in the external memory 25 by the control circuit 24.

The adding/subtracting counter of the position detection circuit 23 maintains its count (the position of the glass 14) even when the power is cut off. The count may be set or reset in response to a set/reset signal.

The control circuit 24 may comprise a microcontroller including a central processing unit (CPU), a ROM, and a RAM. The control circuit 24 (CPU) controls the oscillator circuit 21, the capacitance detection circuit 22, the position detection circuit 23, the external memory 25, and the motor drive circuit 26 in accordance with control programs and application programs stored in the ROM and the RAM.

A window switch 32 located in a center console or the door 11 provides an open or close signal to the control circuit 24. That is, as is common in automobiles, a user may depress a switch in the door or on a console in order to open or close the window.

When receiving the open signal as a user operates the window switch 32, the control circuit 24 outputs a drive control signal to the motor drive circuit 26 for producing reverse rotation of the drive motor 16 unless the window glass 14 is already at the fully open position. In response to the drive control signal, the motor drive circuit 26 operates the drive motor 16 to produce reverse rotation and lowers the glass 14.

When receiving the close signal as a user operates the window switch 32, the control circuit 24 outputs a drive control signal to the motor drive circuit 26 for producing forward rotation of the drive motor 16, unless the window glass 14 is already in the fully closed position. In response to the drive control signal, the motor drive circuit 26 operates the drive motor 16 to produce forward rotation and thus raise the glass 14.

The control circuit 24 temporarily stores data of the position and movement direction of the glass 14, which are detected by the position detection circuit 23, in the external memory 25. The control circuit 24 acquires the present capacitance Cn (digital value converted to the DC voltage Vn) of each capacitive sensor 15 whenever the glass 14 is moved (either in the opening direction or the closing direction) by a distance, which is calculated using the position data and the movement direction data, that is equal to a predetermined reference distance Dk.

After acquiring the present capacitance Cn (digital value converted into the DC voltage Vn) of each capacitive sensor 15 from the capacitance detection circuit 22, the control circuit 24 temporarily stores the value in the external memory 25.

If the control circuit 24 determines that the glass 14 is being raised based on the movement direction data from the position detection circuit 23, the control circuit 24 compares the input of the capacitance Cn (digital value converted into the DC voltage Vn) of each capacitive sensor 15 with the previously stored capacitance Cn-1 (digital value converted into the DC voltage Vn).

Specifically, if the glass 14 is being raised, the control circuit 24 (CPU) determines whether a human body part is approaching whenever the capacitance Cn is input by the capacitance detection circuit 22 by comparing the input with the previously stored capacitance Cn. If the input capacitance Cn is greater than the previously detected capacitance Cn-1 (if the input DC voltage Vn is less than the previous DC voltage Vn-1), the control circuit 24 determines that a human body part is approaching the capacitive sensor 15 and increasing the capacitance Cn of the capacitive sensor 15.

If determining that a human body part is approaching (i.e., located between the glass 14 and the window frame 13), the control circuit 24 outputs a drive control signal to the motor drive circuit 26 to produce reverse rotation of the drive motor 16, which switches the rotation produced by the drive motor 16 from the forward direction to the reverse direction, thereby lowering the glass 14 to the fully open position. As a result, the human body part is prevented from becoming trapped between the glass 14 and the window frame 13.

Figure 4:
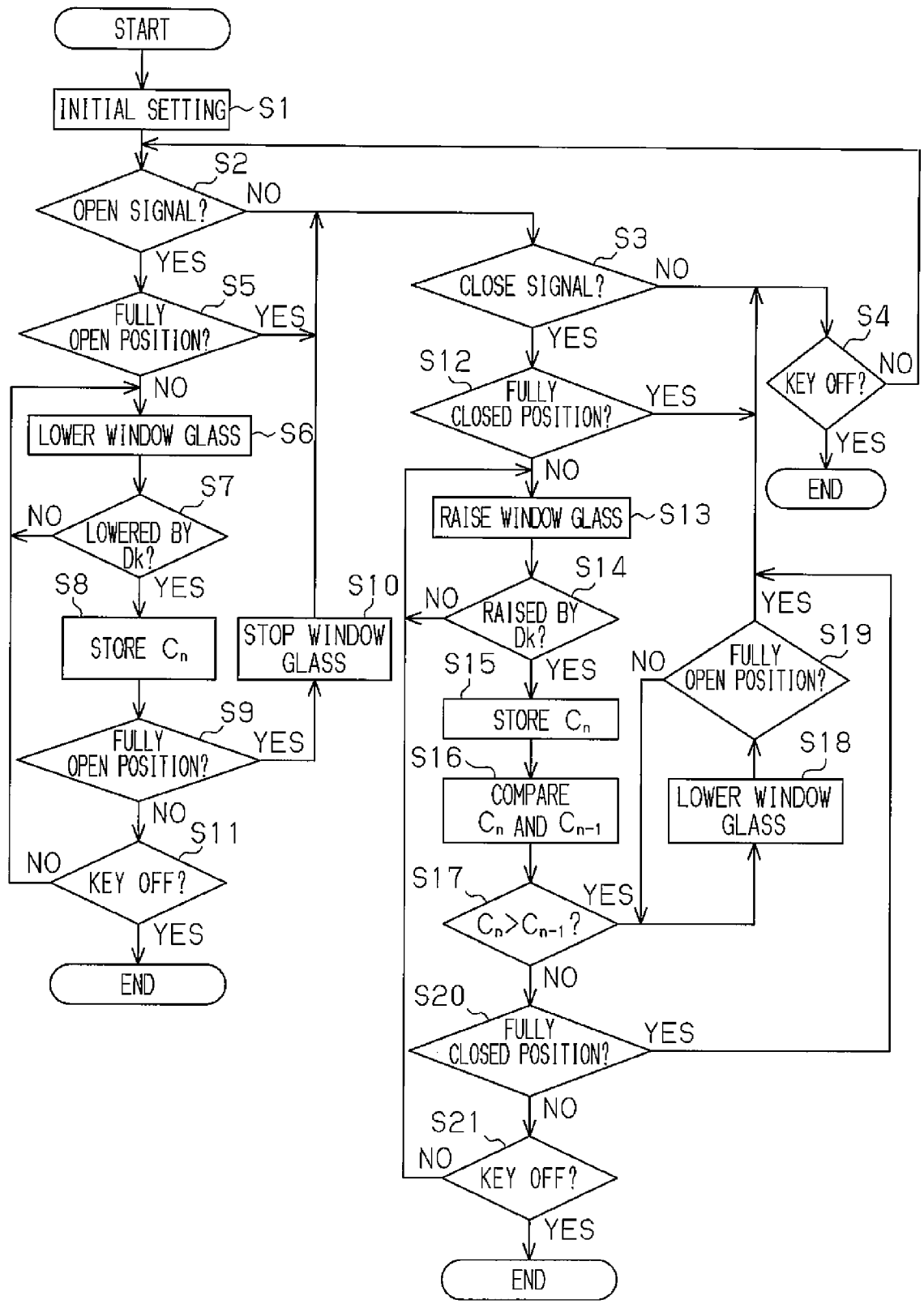
FIG. 4 is a flowchart representing a procedure performed by a control circuit, in accordance with which operation of the entrapment prevention device will be explained.

The operation of the entrapment prevention device 20 will now be discussed with reference to the flowchart of FIG. 4, which illustrates the processing procedures of the control circuit 24.

By performing an ON operation with a car key (not shown) of the vehicle 10, drive power is supplied to the control circuit 24 and other circuits of the entrapment prevention device 20. When power is supplied to the control circuit 24, the control circuit 24 performs operations in accordance with the flowchart of FIG. 4. Further, when supplied with power, the oscillator circuit 21 starts an oscillation operation and applies a sine-wave AC voltage to the capacitance sensors 15.

Upon power on (e.g., via the car key), the control circuit 24 performs an initial set up procedure (step S1). In the initial set up procedure, the control circuit 24 determines the present position of the glass 14 using the count of the adding/subtracting counter in the position detection circuit 23 and stores the position in the external memory 25. Alternatively, the last known position of the glass 14 is read from the memory 25, where it was previously stored. Further, the control circuit 24 receives the present capacitance Cn of each capacitive sensor 15 from the capacitance detection circuit 22 and stores the present capacitance Cn in the external memory 25.

After the initial set up, the control circuit 24 waits for an open or close signal from the window switch 32 or an OFF signal from the key switch (steps S2, S3, and S4).

[Full-Open Operation of the Glass 14]

If the switch 32 is operated by the user to fully open the window glass 14 and an open signal is output by the window switch 32 (YES in step S2), the control circuit 24 reads out the position of the glass 14 stored in the external memory 25 and determines whether the glass 14 is already in the fully open position (step S5). Data for the fully open position of the window glass 14 is obtained in advance and stored in the ROM of the control circuit 24. Comparison is performed with the data for the fully open position.

If it is determined that the window 14 is already in the fully open position (YES in step S5), since the glass 14 can no longer be raised, the control circuit 24 returns to step S2 and waits for a signal generated by a further switch operation.

When the glass 14 is not in the fully open position (NO in step S5), the control circuit 24 produces rotation in the reverse direction of the drive motor 16 to lower the glass 14 (step S6). As a result, the glass 14 is lowered.

When the lowering in the full opening direction starts, the control circuit 24 determines whether the window glass 14 has been lowered by a predetermined reference distance Dk (step S7). The adding/subtracting counter in the position detection circuit 23 performs a count operation when the window glass 14 is lowered in the full opening direction. Thus, the movement distance of the window glass 14 in the full opening direction is determined from the count of the adding/subtracting counter. In the illustrated embodiment, the predetermined reference distance Dk is 5 mm and stored in the ROM of the control circuit 24. The reference distance Dk is set to 5 mm since this is the length of a gap between the window glass 14 and the window frame 13 into which a finger cannot be inserted when the window glass 14 is lowered by 5 mm from the fully closed position.

If the window glass 14 is lowered by the reference distance Dk (YES in step S7), the control circuit 24 reads the present capacitance Cn of each capacitive sensor 15 from the capacitance detection circuit 22 and stores the capacitance Cn in the external memory 25 (step S8). Accordingly, the external memory 25 stores the most recent capacitance Cn of each capacitive sensor 15 together with the previously stored capacitance Cn-1 of the capacitive sensor 15.

After storing the most recent capacitance Cn of each capacitive sensor 15 in the external memory 25, the control circuit 24 determines whether the window glass 14 has reached the fully open position from the count of the adding/subtracting counter in the position detection circuit 23 (step S9). If it is determined that the window glass 14 has reached the fully open position (YES in step S9), the control circuit 24 determines that the window glass 14 is now in the fully open state and stops the drive motor 16 through the motor drive circuit 26 to stop lowering the window glass 14 (step S10). Then, the control circuit 24 returns to step S3 and waits for a further switch operation.

If it is determined that the window glass 14 has not reached the fully open position (NO in step S9), the control circuit 24 determines whether an OFF signal has been output from the key switch (step S11). If an OFF signal has not been output from the key switch (NO in step S11), the control circuit 24 returns to step S6. In other words, until the window glass 14 reaches the fully open position or an OFF operation is performed with the key, the control circuit 24 detects the presently most recent capacitance Cn of each capacitive sensor 15 and stores the capacitance Cn in the external memory 25 while lowering the window glass 14.

[Full-Close Operation of the Window Glass 14]

If the window switch 32 is operated by the user to fully close the window glass 14 and the window switch 32 outputs the close signal (YES in step S3), the control circuit 24 reads out the position of the window glass 14 from the external memory 25 and determines whether the window glass 14 is located at the fully closed position (step S12). Data for the fully closed position of the window glass 14 is obtained in advance and stored in the ROM of the control circuit 24. Comparison is performed with the data for the fully closed position.

If it is determined that the window glass 14 is presently located at the fully closed position (YES in step S12), since the window glass 14 can no longer be moved in the closing direction, the control circuit 24 proceeds to step 4 and waits for a further switch operation.

When determining that the window glass 14 is not located at the fully closed position (NO in step S12), the control circuit 24 produces rotation in the forward direction with the drive motor 16 through the motor drive circuit 26 to raise the window glass 14 (step S13). As a result, the window glass 14 is raised in the full closing direction.

When the raising in the full closing direction starts, the control circuit 24 determines whether the window glass 14 has been raised by the predetermined reference distance Dk (step S14). The adding/subtracting counter in the position detection circuit 23 performs a count operation when the window glass 14 is lowered in the full closing direction. Thus, the movement distance of the window glass 14 in the full closing direction is determined from the count of the adding/subtracting counter.

If the window glass 14 is raised by the reference distance Dk (YES in step S14), the control circuit 24 reads the present capacitance Cn of each capacitive sensor 15 from the capacitance detection circuit 22 and stores the capacitance Cn in the external memory 25 (step S15). Accordingly, the external memory 25 stores the most recent capacitance Cn of each capacitive sensor 15 together with the previously stored capacitance Cn-1 of the capacitive sensor 15.

After storing the most recent capacitance Cn of each capacitive sensor 15 in the external memory 25, the control circuit 24 compares the most recent capacitance Cn with the previously stored capacitance Cn-1 for each capacitive sensor 15 (step S16).

Subsequently, the control circuit 24 determines whether the most recent capacitance Cn is greater than the previously stored capacitance Cn-1 in any one of the capacitance sensors 15 (step S17). In other words, it is determined whether the capacitance Cn has increased in at least one of the capacitance sensors 15 due to a human body or a human body part approaching the space between the window glass 14 and the window frame 13.

If the control circuit 24 determines that the most recent capacitance Cn is greater than the previously stored capacitance Cn-1 in at least one of the capacitance sensors 15 (YES in step S17), the control circuit 24 determines that there is a foreign object that may be entrapped between the window glass 14 and the window frame 13. Then, the control circuit 24 produces rotation in the reverse direction with the drive motor 16 through the motor drive circuit 26 to lower the window glass 14 to the fully open position and avoid entrapment of the object (steps S18 and S19). When the window glass 14 reaches the fully open position (YES in step S19), the control circuit 24 returns to step S3 and waits for a further switch operation.

If the control circuit 24 determines that the most recent capacitance Cn is greater than the previously stored capacitance Cn-1 is none of the capacitance sensors 15 (NO in step S17), the control circuit 24 determines whether the window glass 14 has reached the fully closed position from the count of the adding/subtracting counter of the position detection circuit 23 (step S20). When determining that the window glass 14 has reached the fully closed position (YES in step S20), the control circuit 24 determines that the window glass 14 is in the fully closed state and stops the drive motor 16 through the motor drive circuit 26 to stop raising the window glass 14 (step S19). Subsequently, the control circuit 24 returns to step S4 and waits for a further switch operation.

When determined that the window glass 14 has not reached the fully closed position (NO in step S20), the control circuit 24 determines whether an OFF signal has been output from the key switch (step S21). If an OFF signal has not been output from the key switch (NO in step S21), the control circuit 24 returns to step S13. In other words, until the window glass 14 reaches the fully closed position or an OFF operation is performed with the key, the control circuit 24 detects the presently most recent capacitance Cn of each capacitive sensor 15 and stores the capacitance Cn in the external memory 25 while raising the window glass 14. The control circuit 24 also compares the most recent capacitance Cn of each capacitive sensor 15 with the previous capacitance Cn-1. Further, the control circuit 24 raises the window glass 14 to the fully closed position while determining whether there is presently a foreign object.

The illustrated embodiment has the advantages described below.

(1) In the illustrated embodiment, the capacitance sensors 15 are arranged on the window glass 14. If a human body or a human body part approaches the window glass 14, the capacitance Cn of the capacitance sensors 15 increases. The control circuit 24 compares the most recent capacitance Cn detected by each capacitive sensor 15 with the previously obtained capacitance Cn-1. When the most recent capacitance Cn is greater than the previous capacitance Cn-1, the control circuit 24 determines that a human body or a human body part has approached the window glass 14. The control circuit 24 then moves the window glass 14 in the opening direction.

Accordingly, entrapment is avoided before a human body or a human body part becomes directly entrapped by the window glass 14. Thus, the human body or human body part is not injured.

(2) In the illustrated embodiment, the control circuit 24 determines the approach of a human body or a human body part by comparing the presently most recent capacitance Cn detected by each capacitive sensor 15 with the previously obtained capacitance Cn-1. This prevents entrapment under any condition. In other words, various types of entrapment are detected under different conditions with a simple structure without the need for setting different parameters (different reference values) for different entrapment conditions.

(3) In the illustrated embodiment, since the positive electrode film 15a and the negative electrode film 15b are electrode film and thus may easily be applied to the peripheral surface 14a of the window glass 14 without the need for ensuring a large space. Further, the positive and negative electrode films 15a and 15b are transparent. Thus, the electrode films 15a and 15b are advantageous in aesthetic terms since they may be applied to the window glass 14 without standing out, and the electrode films 15a and 15b do not limit view.

It should be apparent to those skilled in the art that the present invention may be embodied in many other specific forms without departing from the spirit or scope of the invention. Particularly, it should be understood that the present invention may be embodied in the following forms.

In the illustrated embodiment, the entrapment prevention device 20 lowers the window glass 14 to the fully open position in the full opening direction as soon as it detects a human body or a human body part. Instead, the window glass 14 may immediately be stopped or moved by a certain distance in the full opening direction before being stopped.

In the illustrated embodiment, a plurality of capacitance sensors 15 are arranged on the peripheral surface 14a of the window glass 14. However, the quantity of the capacitance sensors 15 is not especially limited and may be in any number as long as the range of detection is not restricted.

In the illustrated embodiment, entrapment detection is performed until the window glass 14 reaches the fully closed position. However, the entrapment detection operation may be ended before the window glass 14 reaches the fully closed position, that is, when the gap between the peripheral surface 14a of the window glass 14 and the inner surface 13a of the window frame 13 becomes equal to the distance in which the capacitance Cn of the capacitance sensors 15 arranged on the peripheral surface 14a of the window glass 14 changes due to the approach of the window frame 13.

In the illustrated embodiment, it is determined that a human body or a human body part is approaching the window glass 14 when the most recent capacitance Cn is greater than the previously obtained capacitance Cn-1. However, since a detection error may occur due to noise, a predetermined margin (reference value) may be provided for the detection. For example, the approach of a human body or a human body part to the window glass 14 may be determined if the most recent capacitance Cn is greater than a value obtained by adding the margin (the reference value) to the previously obtained capacitance Cn-1.

In the illustrated embodiment, a horizontal electrode arrangement is used in which the positive electrode films 15a (the first electrodes) and the negative electrode films 15b (the second electrodes) of the capacitance sensors 15 are arranged on the peripheral surface 14a of the window glass 14. Instead, a parallel electrode arrangement may be used by arranging the first electrodes (the positive electrode films 15a) so that they face toward the second electrodes (the second electrode films 15b), with the first electrodes of the capacitance sensors 15 arranged on the peripheral surface 14a of the window glass 14 and the second electrodes of the capacitance sensors 15 arranged on the inner surface 13a of the window frame 13. It is obvious that the second electrodes may be arranged on the peripheral surface 14a of the window glass 14 and the first electrodes arranged on the inner surface 13a of the window frame 13.

In the parallel electrode arrangement, as the window glass 14 becomes closer to the fully closed position, the distance between the first electrodes and the second electrodes becomes shorter. This increases the capacitance Cn of the capacitance sensors 15. Accordingly, the increase in capacitance Cn when the window glass 14 is located at the fully closed position, the state in which a human body or a human body cannot approach the window glass 14, is stored in advance in the external memory 25 as increase data. When comparing the most recent capacitance Cn and the previously obtained capacitance Cn-1, the increase in the capacitance Cn caused by the approach of the window glass 14 to the fully closed position as the window glass 14 moves from the position corresponding to the previously obtained capacitance Cn-1 to the position corresponding to the most recent capacitance Cn is obtained. If the most recent capacitance Cn is greater than a value obtained by adding the increase to the previously obtained capacitance Cn-1, it is determined that a human body or a human body part has approached the window glass 14.

In the illustrated embodiment, the positive electrode films 15a (the first electrodes) and the negative electrode films 15b (the second electrodes) of the capacitance sensors 15 are arranged on the peripheral surface 14a of the window glass 14. However, the first electrodes and the second electrodes of the capacitance sensors may be arranged on the inner surface 13a of the window frame 13. A receiving position for the capacitance sensors is not limited to a location that comes into direct contact with the window glass 14 and includes adjacent positions. Accordingly, the capacitance sensors may be arranged on a synthetic resin visor arranged on the window frame 13.

In the illustrated embodiment, each capacitive sensor 15 is formed by the positive electrode film 15a (the first electrode) and the negative electrode film 15b (the second electrode). However, the negative electrode film 15b (the second electrode) may be omitted and replaced by a grounded terminal. That is, a single electrode arrangement may be used for the capacitance sensors.

The drive motor 16 is used as an actuator in the illustrated embodiment. However, any actuator may be used as long as the actuator performs opening and closing with the window glass 14 (the movable body). For example, an air cylinder may be used in lieu of the drive motor 16 to perform opening and closing with the movable body.

In the illustrated embodiment, the most recent capacitance Cn is compared with the previously obtained capacitance Cn-1 to determine the approach of a human body or a human body part. Instead, the capacitance may be obtained at different positions when raising the window glass 14. Then, the obtained capacitances may be added and divided by the number of times the capacitances have been obtained to calculate an average value Cnave. The average Cnave is then compared with the most recent capacitance Cn. This absorbs noise and allows determination of the approach of a foreign object to the window glass 14 while preventing erroneous detection.

In the illustrated embodiment, it is determined whether the window glass 14 is located at the fully closed position in step S12. If the window glass 14 is located at the fully closed position, the processing returns to step S4. On the other hand, if the window glass 14 is not located at the fully closed position, the window glass 14 is raised in the full closing direction.

However, in step S12, in addition to determining whether the window glass 14 is located at the fully closed position, it may be determined whether a gap of 5 mm or greater is formed by the window glass 14. If the gap formed by the window glass 14 is less than 5 mm, the processing returns to step S4. On the other hand, if the gap is 5 mm or greater, the window glass 14 is raised in the full closing direction.

This prevents entrapment even when the window glass 14 is slightly open such that a finger may enter the gap.

In the illustrated embodiment, the present invention prevents entrapment by the window glass 14 of the vehicle. However, the invention may be applied to prevent entrapment by an automatic glass door for an entrance of a building or a room or an elevator door.

The present examples and embodiments are to be considered as illustrative and not restrictive, and the invention is not to be limited to the details given herein, but may be modified within the scope and equivalence of the appended claims.

What is claimed is:

1. An entrapment prevention device for an opening/closing mechanism including a capacitive sensor arranged on at least one of a movable body, which opens or closes a space when an actuator is driven, and a receiving position, at which the movable body is received at a fully closed position, wherein the entrapment prevention device detects a foreign object between the movable body and the receiving position with the capacitive sensor during a closing movement and avoids entrapment of the foreign object between the movable body and the receiving position, the entrapment prevention device comprising:
   an actuator drive means for driving the actuator to perform an opening/closing movement with the movable body;
   a capacitance calculation means for receiving a detection signal from the capacitive sensor and calculating a present capacitance;
   a memory for storing the capacitance calculated by the capacitance calculation means;
   a comparison circuit for comparing a most recent capacitance calculated by the capacitance calculation means with a previous capacitance stored in the memory;
   a determination means for determining whether a foreign object is located between the movable body and the receiving position based on the comparison of the comparison means; and
   an actuator drive control means, connected to the determination means, for outputting a drive control signal to the actuator drive means to stop the movable body or perform an opening movement of the movable body by the actuator when the determination means determines that a foreign object is located between the movable body and the receiving position, and
   wherein the capacitive sensor comprises a plurality of paired sheet or film electrodes disposed proximate to an outer perimeter of the one of the movable body and the receiving position.

2. The entrapment prevention device of claim 1, wherein the determination means determines that a foreign object is located between the movable body and the receiving position when, in the comparison means, the most recent capacitance calculated by the capacitance calculation means is greater than a previous capacitance stored in the memory.

3. The entrapment prevention device of claim 1, further comprising:
   a position calculation means for calculating the position of the movable body based on a detection signal from a position sensor that detects the position of the movable body, and
   wherein the capacitance calculation means calculates the most recent capacitance whenever the movable body is moved by a predetermined distance in a closing direction.

4. The entrapment prevention device of claim 3, wherein the previous capacitance compared with the most recent capacitance was the most recent capacitance calculated at the time when the movable body was located at a previous position before the capacitance calculation means calculated the most recent capacitance.

5. The entrapment prevention device of claim 3, wherein the previous capacitance compared with the most recent capacitance is an average value of most recent capacitances calculated when the movable body was located at a plurality of predetermined positions before the capacitance calculation means calculated the most recent capacitance.

6. The entrapment prevention device of claim 5, wherein the movable body is a window glass arranged in a door of a vehicle.

7. An entrapment prevention device for an automobile window, wherein a glass of the window moves within a frame between an open position and a closed position, the entrapment prevention device comprising:
- a capacitive sensor comprising a plurality of paired sheet or film electrodes that generates a detection signal, wherein the paired electrodes are arranged proximate to a first edge of the glass, and wherein the first edge of the glass is received within the frame when the window is in the closed position;
- an actuator that moves the glass between the open position and the closed position;
- a capacitance calculation means coupled to the capacitive sensor that receives the detection signal from the capacitive sensor and calculates a current capacitancae;
- a memory coupled to the capacitance calculation means for storing the current capacitance;
- a comparison circuit for comparing a most recent capacitance calculated by the capacitance calculation means with a previous capacitance stored in the memory means;
- a determination means for determining whether a foreign object is located between the glass and the window frame based on the comparison by the comparison means; and
- an actuator drive controller that outputs a drive control signal to the actuator to stop the glass from moving towards the frame when the determination means determines that a foreign object is located between the window and the frame.

8. The entrapment prevention device of claim 7, wherein the drive control signal output by the actuator drive controller stops the glass from moving towards the frame and reverses the direction of movement so that the glass moves away from the frame.

* * * * *